(12) United States Patent
Benedix et al.

(10) Patent No.: US 7,428,662 B2
(45) Date of Patent: Sep. 23, 2008

(54) TESTING A DATA STORE USING AN EXTERNAL TEST UNIT FOR GENERATING TEST SEQUENCE AND RECEIVING COMPRESSED TEST RESULTS

(75) Inventors: Alexander Benedix, München (DE); Reinhard Düregger, Poing (DE); Robert Hermann, Pipinsried (DE); Wolfgang Ruf, Friedberg (DE)

(73) Assignee: Infineon Technologies AG, Neubiberg (DE)

( * ) Notice: Subject to any disclaimer, the term of this patent is extended or adjusted under 35 U.S.C. 154(b) by 314 days.

(21) Appl. No.: 10/478,403

(22) PCT Filed: May 15, 2002

(86) PCT No.: PCT/EP02/05358

§ 371 (c)(1),
(2), (4) Date: Nov. 21, 2003

(87) PCT Pub. No.: WO02/095763

PCT Pub. Date: Nov. 28, 2002

(65) Prior Publication Data

US 2004/0151037 A1    Aug. 5, 2004

(30) Foreign Application Priority Data

May 21, 2001   (DE) ............................... 101 24 923

(51) Int. Cl.
*G06F 11/00* (2006.01)
*G06F 11/277* (2006.01)

(52) U.S. Cl. .......................... 714/30; 714/718; 714/738

(58) Field of Classification Search ................... 714/21, 714/54, 27, 30, 718, 719, 738
See application file for complete search history.

(56) References Cited

U.S. PATENT DOCUMENTS 5,406,566 A    4/1995   Obara (Continued)

FOREIGN PATENT DOCUMENTS

EP         0 599 524 A2    6/1994

(Continued)

OTHER PUBLICATIONS

Registers by Charles Kozierok http://www.pcguide.com/ref/cpu/arch/int/compRegisters-c.html version from Aug. 17, 2000 found via the Way Back Machine.*

(Continued)

*Primary Examiner*—Scott T Baderman
*Assistant Examiner*—Joseph Schell
(74) *Attorney, Agent, or Firm*—Eschweiler & Associates, LLC (57) ABSTRACT

Disclosed is a test method for testing a data store having an integrated test data compression circuit where the data store has a memory cell array with a multiplicity of addressable memory cells, read/write amplifiers for reading and writing data to the memory cell via an internal data bus in the data store and a test data compression circuit which compresses test data sequences, which are each read serially from the memory cell array, with stored reference test data sequences in order to produce a respective indicator data item which indicates whether at least one data error has occurred in the test data sequence which has been read.

11 Claims, 6 Drawing Sheets

U.S. PATENT DOCUMENTS

| | | | |
|---|---|---|---|
| 5,617,531 A * | 4/1997 | Crouch et al. | 714/30 |
| 5,673,270 A | 9/1997 | Tsujimoto | |
| 5,689,514 A * | 11/1997 | Saitoh | 714/719 |
| 5,946,246 A * | 8/1999 | Jun et al. | 365/201 |
| 6,032,274 A * | 2/2000 | Manning | 714/718 |
| 6,058,056 A | 5/2000 | Beffa et al. | |
| 6,085,346 A * | 7/2000 | Lepejian et al. | 714/733 |
| 6,163,491 A | 12/2000 | Iwamoto et al. | |
| 6,243,840 B1 * | 6/2001 | Raad et al. | 714/719 |
| 6,370,661 B1 * | 4/2002 | Miner | 714/718 |
| 6,484,278 B1 * | 11/2002 | Merritt et al. | 714/719 |
| 6,636,998 B1 * | 10/2003 | Lee et al. | 714/735 |
| 6,671,836 B1 * | 12/2003 | Lai et al. | 714/718 |
| 6,694,461 B1 * | 2/2004 | Treuer | 714/719 |
| 2001/0044917 A1 * | 11/2001 | Lester et al. | 714/718 |
| 2002/0174382 A1 * | 11/2002 | Ledford et al. | 714/30 |

FOREIGN PATENT DOCUMENTS

| | | |
|---|---|---|
| JP | 04-351798 A | 12/1992 |
| JP | 11-213699 A | 8/1999 |
| JP | 2001-110200 A | 4/2001 |

OTHER PUBLICATIONS

Upgrading and Repairing PCs, 13th Edition by Scott Mueller Published by Que, Aug. 27, 2001 section USB and IEEE-1394 (i.Link or FireWire)—Serial and Parallel Port Replacements (first page).*
SearchSMB.com Definitions of Buffer last modified Oct. 5, 1999 http://searchsmb.techtarget.com/sDefinition/0,,sid44_gci211713,00.html.*
Wikipedia's Buffer (telecommunication) http://en.wikipedia.org/wiki/Buffer_%28telecommunication%29 retrieved May 2, 2007.*
Wikipedia's Buffer (computer science) http://en.wikipedia.org/wiki/Buffer_%28computer_science%29 retrieved May 2, 2007.*

* cited by examiner

Fig. 1

(Prior art)

TESTING A DATA STORE USING AN EXTERNAL TEST UNIT FOR GENERATING TEST SEQUENCE AND RECEIVING COMPRESSED TEST RESULTS

CLAIM FOR PRIORITY

This application claims the benefit of priority to international application PCT/EP02/05358, which was filed on May 15, 2002 and published in the German language on Nov. 28, 2002, which application claims benefit to German application DE 10124923.3, filed May 21, 2001.

TECHNICAL FIELD OF THE INVENTION

The invention relates to a test method for testing a data store and to a data store having an integrated test data compression circuit for inexpensively testing fast semiconductor memories, particularly DRAM stores, and SRAM stores working at very high operating clock frequencies.

BACKGROUND OF THE INVENTION

Figure 1:
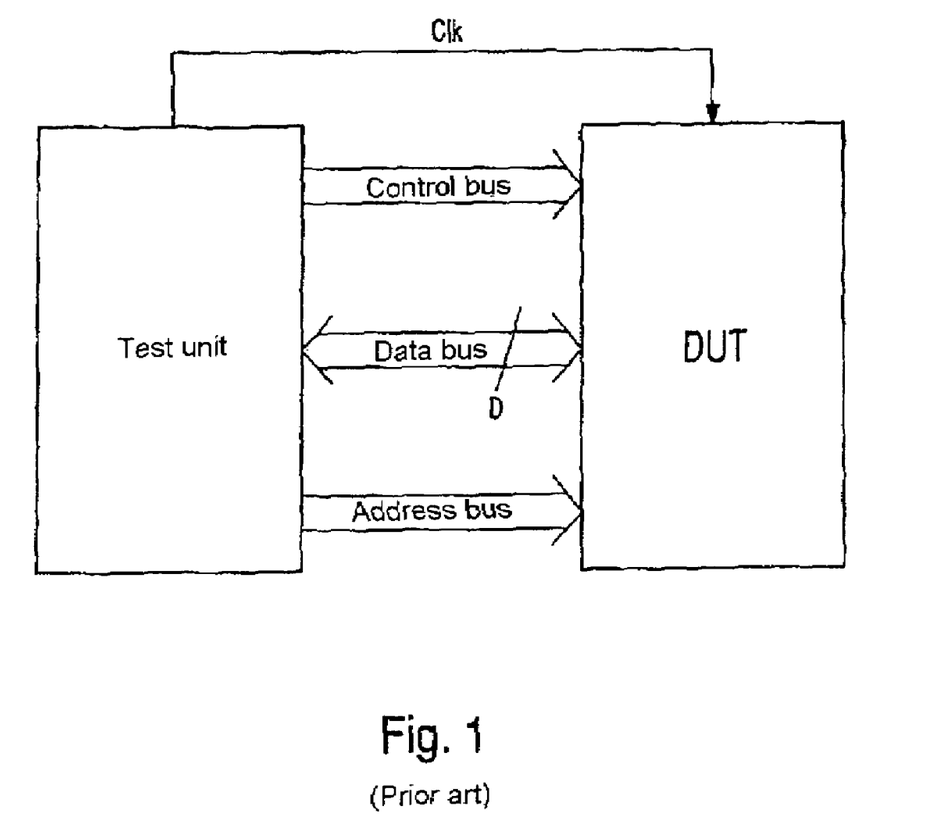
FIG. 1 shows a test arrangement based on the prior art.

FIG. 1 shows a test arrangement based on the prior art. A circuit to be tested DUT (device under test) is connected to an external test unit via a control bus, a data bus and an address bus. The external test unit uses a test data generator to produce test data which are applied via data bus lines in a data bus to the memory which is to be tested DUT. The address bus is used to address the memory cells which are to be tested within the memory which is to be tested. In this case, the test data are written to the address memory cells via the data bus and are subsequently read again. The external test unit compares the written test data with the data which have been read and recognizes from the discrepancies or data errors whether the addressed memory cells within the memory are functional.

Figure 2:
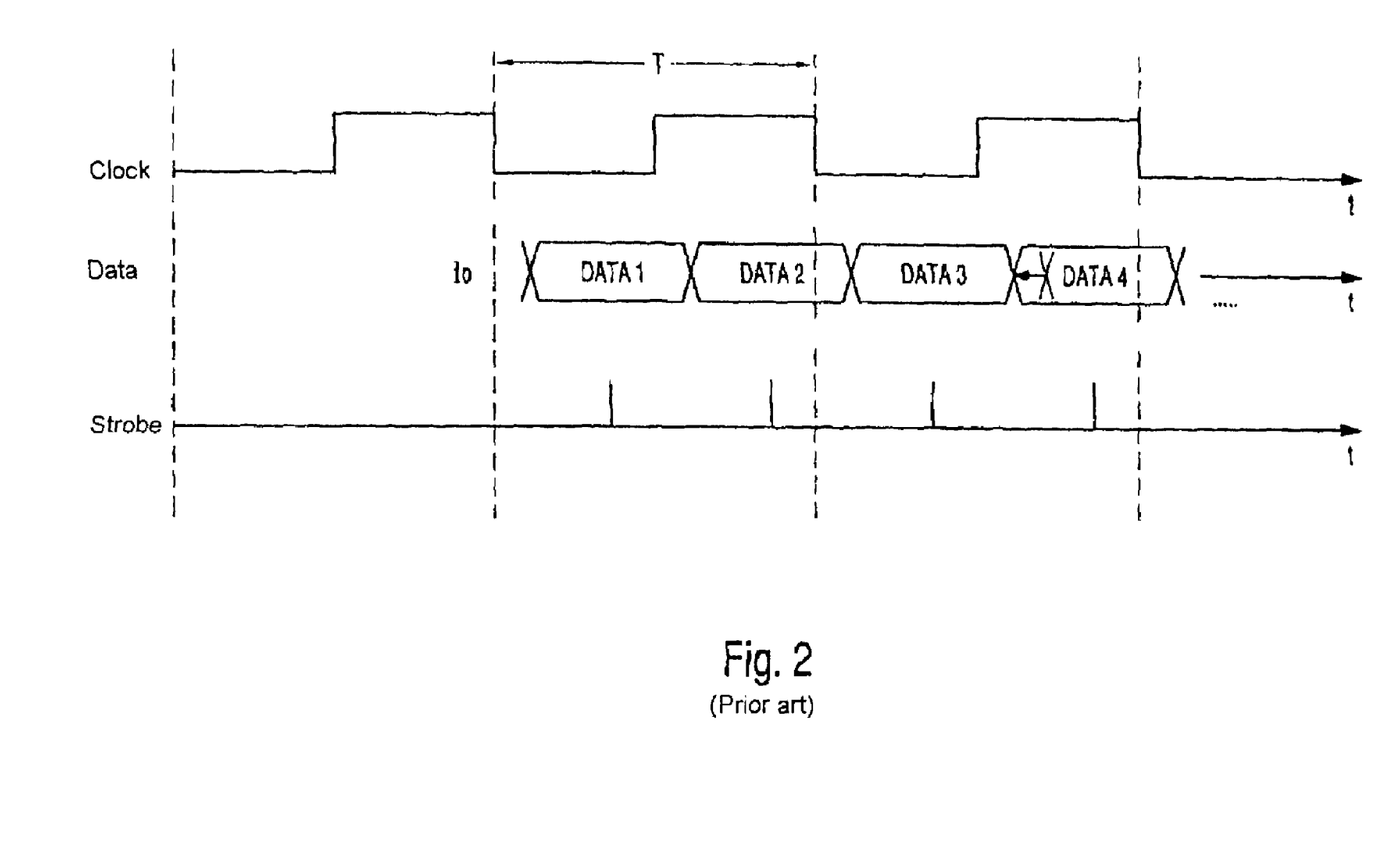
FIG. 2 shows a flow diagram to explain the problem underlying the invention.

FIG. 2 shows flow diagrams for the prior art test arrangement shown in FIG. 1. The test unit transmits the test data via a data line at a high clock frequency and subsequently reads them from the data store again On each data line in the data bus, the test unit receives a test data sequence, which comprises four test data in the example shown in FIG. 2. Such a test data sequence is also referred to as a data burst. The test unit produces an internal strobe signal, with each strobe signal involving a received test data item being compared with a stored reference data item within the test unit, so that data discrepancies can be ascertained. These data discrepancies indicate that the addressed memory cell within the data store is faulty. Modern data stores work at ever higher operating clock frequencies, which means that the data transmission rates at which the test data are written to the memory cells and are subsequently read again are likewise becoming higher and higher. For this reason, the operating clock frequency of the external test unit, in which the test data which have been read are evaluated, likewise needs to be increased. In the example shown in FIG. 2, the clock frequency of the strobe signal corresponds to the data transmission rate of the test data which have been read. With the increasing data transmission rate of the semiconductor memory which is to be tested, it is therefore necessary for the test unit to be adapted accordingly in the test arrangement shown in FIG. 1. The ever shorter development cycles for developing modern data stores working at ever higher data transmission rates mean that the test units used heretofore can no longer be used for testing developed data stores in many cases. At very high data transmission rates for the data store which is to be tested, test units which have relatively complex circuitry and are thus cost intensive are therefore required.

SUMMARY OF THE INVENTION

Disclosed is a test method for testing a data store and a data store which allow a data store which has a very high operating clock frequency to be testing a conventional test unit which works at a lower clock frequency.

The invention provides a test method for testing a data store, which involves a plurality of test data in a test data sequence which have been read serially from the data store being compared with reference test data in order to produce a compressed indicator data item, the indicator data item indicating whether at least one data error has occurred in the test data sequence.

In this case, the test data sequence preferably comprises a prescribed number of test data bits.

The test data sequence is preferably produced in a test data generator in an external test unit and is written to a memory cell array in the data store via a data line in a data bus, with the test data sequence writ ten subsequently being read from the memory cell array again via a data line in the data bus and being compressed by a compression circuit integrated in the data store on the basis of a compression factor to form an indicator data item, the indicator data item being sent from the data store to the external test unit via an associated indicator line in an indicator data bus for the purpose of data evaluation.

The compression factor is preferably equal to the number of test data bits in a test data sequence.

The test data are preferably written to the memory cell array by the external test unit at a first data transmission rate and the indicator data are sent from the data store to the external test unit at a second data transmission rate, the ratio of the first data transmission rate to the second data transmission rate corresponding to the compression factor.

In one preferred embodiment of the inventive test method, the test data in a test data sequence which are read are written serially to a test data register in the compression circuit and are compared bit by bit with reference data, which are stored in a reference register in the compression circuit, by a logic comparison circuit in order to produce an indicator data item.

In this case, the reference data are written to the reference data register in the compression circuit by the external test unit in an initialization mode of operation.

The invention also provides a data store having an integrated test data compression circuit, where the data store has:

a memory cell array with a multiplicity of addressable memory cells, read/write amplifiers for reading and writing data to the memory cells via an internal data bus in the data store, and a test data compression circuit which compresses a plurality of test data sequences, which are each read serially from the memory cell array via a data line in the internal data bus in a test mode of operation, with stored reference test data sequences in order to produce a respective indicator data item which indicates whether at least one data error has occurred in the test data sequence which has been read.

In this case, the indicator data produced by the test data compression circuit are respectively transmitted from the data store to an external test unit via an indicator data line in an indicator data bus for the purpose of further data evaluation.

The inventive data store preferably contains a controllable switching unit which is connected between an external data bus for data interchange with the external test unit, the internal data bus for data interchange with the memory cell array, and the data compression circuit.

The controllable switching unit can preferably be changed over by the external test unit between a normal mode of operation and a test mode of operation via control lines, with the test data in a test data sequence which have been read via a data line in the internal data bus being written serially to a test data register in the test data compression circuit via a data line in an internal test data bus by the switching unit in the test mode of operation.

The external data bus, the internal data bus, the test data bus and the indicator data bus preferably have the same bus width.

In one particularly preferred embodiment of the inventive data store, the test data compression circuit contains a plurality of test data compression circuit modules which each have a test data register for storing a test data sequence read from the memory cell array via a data line in the test data bus, a reference data register for storing a reference test data sequence, and a logic comparison circuit which compares the stored test data sequence with the stored reference test data sequence in order to produce an indicator data item.

The logic comparison circuit is preferably an XOR logic circuit.

BRIEF DESCRIPTION OF THE DRAWINGS

A preferred embodiment of the inventive test method and of the inventive data store is described below with reference to the appended figures, in which.

DETAILED DESCRIPTION OF THE INVENTION

Figure 3:
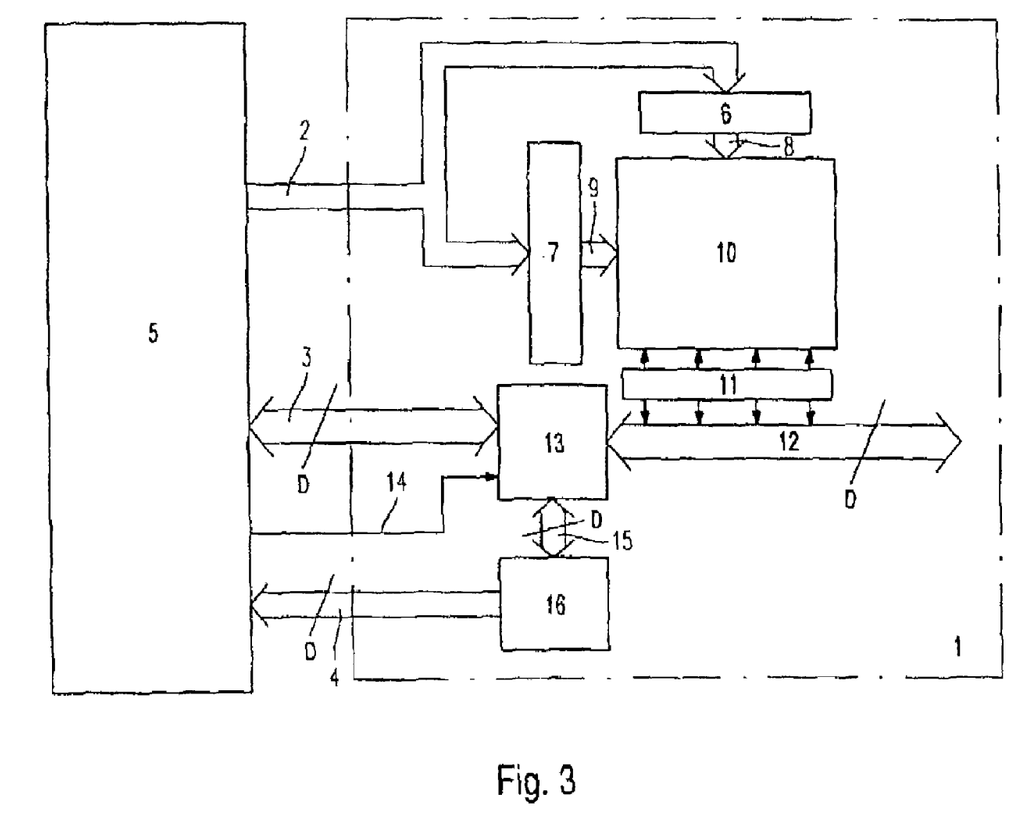
FIG. 3 shows a block diagram of a preferred embodiment of the inventive data store.

FIG. 3 shows a block diagram of an inventive data store 1 which is connected to an external test unit 5 via an address bus 2, an external data bus 3 and an indicator data bus 4. The address bus 2 is connected to a column address decoder 6 and to a row address decoder 7 which decode the applied addresses and use lines 8, 9 to activate memory cells within the memory cell array 10. The memory cell array 10 is connected to an internal data bus 12 in the data store 1 via read/write amplifiers 11. Between the external data bus 3 and the internal data bus 12 there is a controllable switching unit 13 which can be actuated by the external test unit 5 via control lines 14. The switching device 13 has a test data compression circuit 16 connected to it via an internal test data bus 15.

Figure 4:
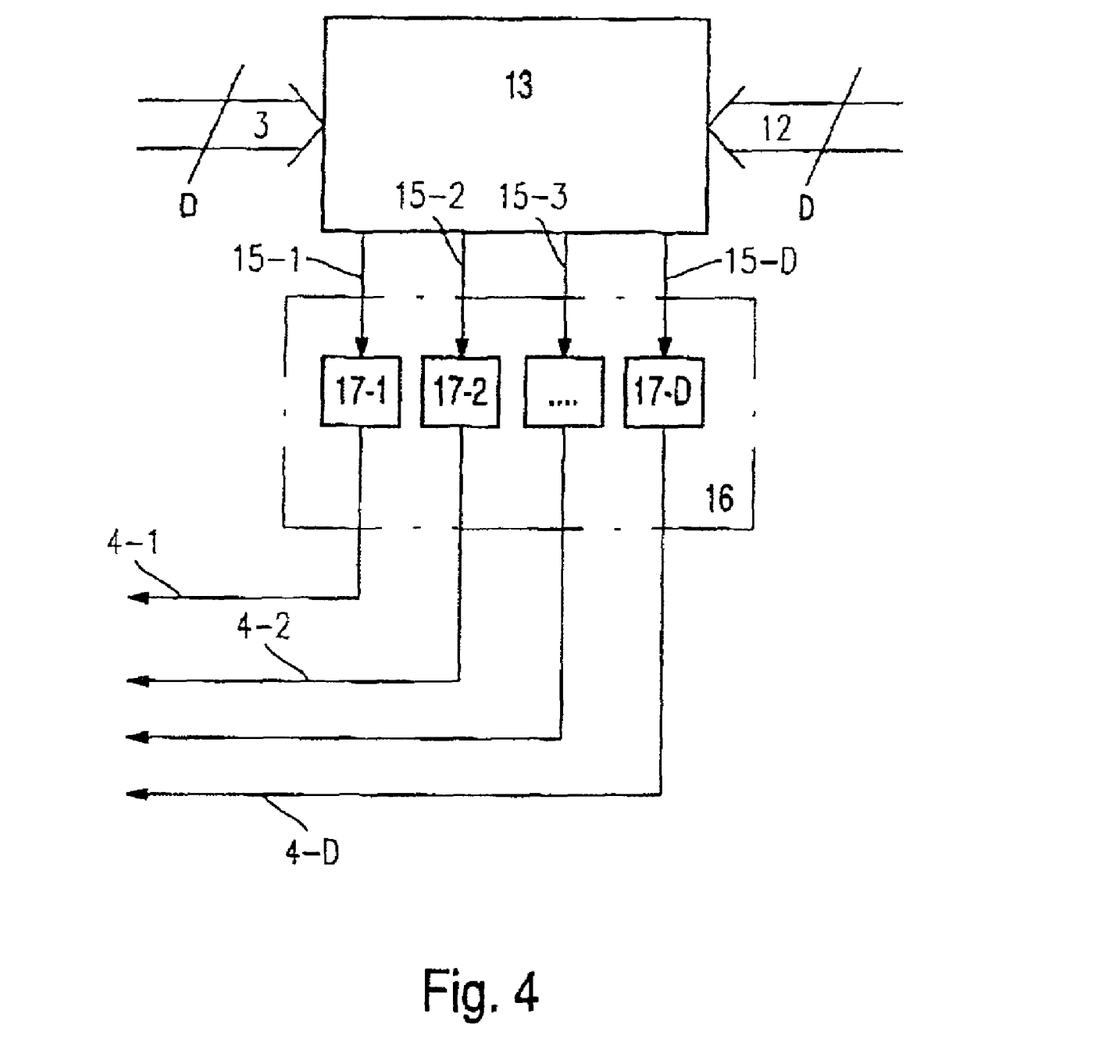
FIG. 4 shows a block diagram of a test data compression circuit contained in the inventive data store, with a plurality of test data compression circuit modules.

FIG. 4 shows a block diagram of the test data compression circuit 16. The test data compression circuit 16 is connected to the switching unit 13 via data lines 15-$i$. The data bus width of the test data bus 15 between the switching unit 13 and the integrated test data compression circuit 16 corresponds to the data bus width of the external data bus 3 and of the internal data bus 12. The test data compression circuit contains D test data compression circuit modules 17-$i$ which each produce an indicator data item which is sent to the external test unit 5 via an indicator data line 4-$i$ for the purpose of further data evaluation.

Figure 5:
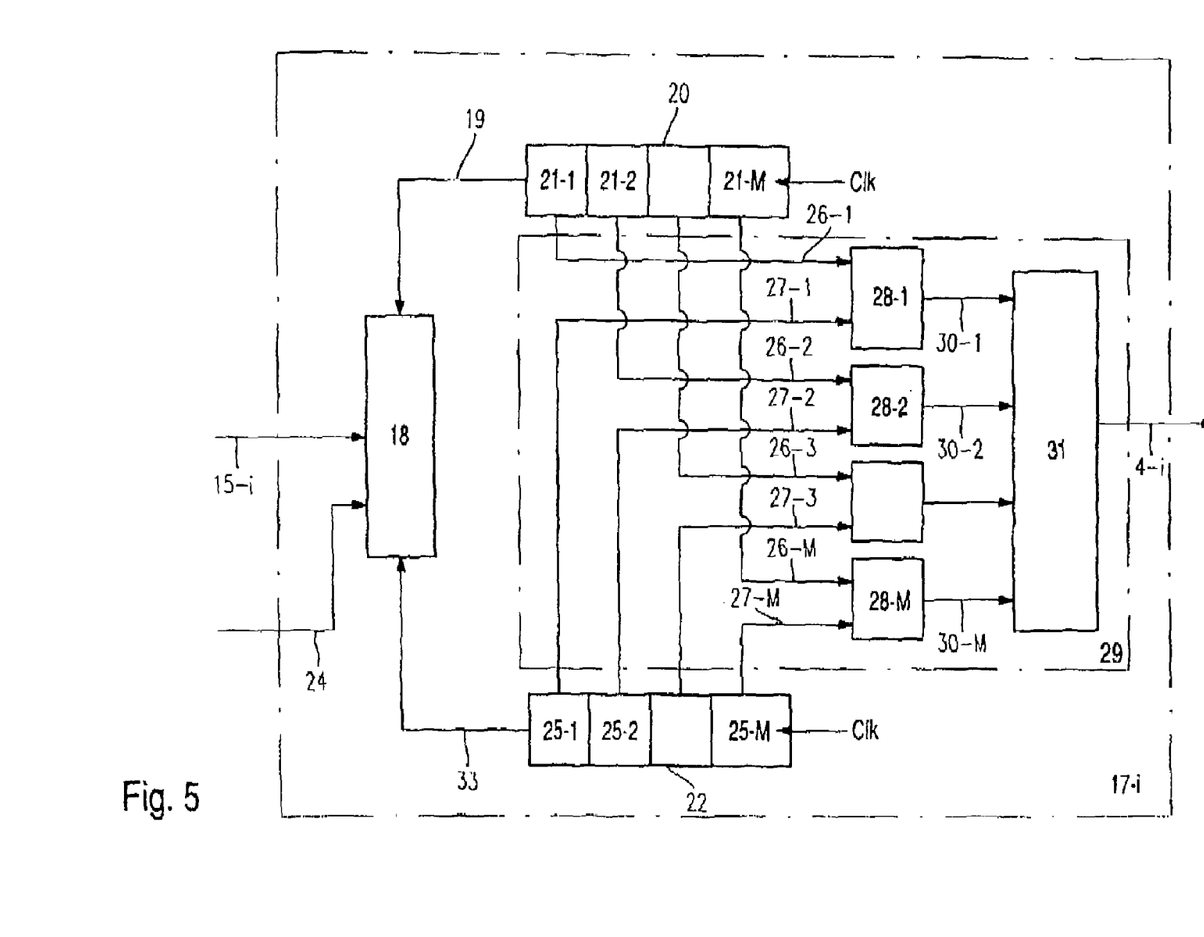
FIG. 5 shows a block diagram of a test data compression circuit module within the test data compression circuit shown in FIG. 4.

FIG. 5 shows the circuit design of a test data compression circuit module 17 in detail. The test data compression circuit module 17 receives via a data line in the internal test data bus 15 a test data sequence, comprising a plurality of the test data bits, which has been read from the memory cell array 10. The received test data sequence is written serially to a clocked test data register 20 via a controllable internal switch 18 and a data line 19. The test data register contains a storage location 21 for each test data bit in the test data sequence. The number M of storage locations 21 corresponds to the number of test data bits within a test data sequence or a test data burst.

Each test data circuit module 17-$i$ contains a clocked reference data register 22 for storing reference test data. The reference data register 22 is likewise connected to the controllable change-over switch 18, which is actuated by the external test unit 5 via a control line 24, via a line 23. The clocked reference data register 22 contains a plurality of storage locations 25 for reference data bits. The reference data register 22 stores M reference data bits which are written to the reference data register 22 by the external test unit 5 during an initialization phase The storage locations 21 within the test data register 20 are connected via lines 26, and the storage locations 25 within the test data register 22 are connected via lines 27, to inputs on XOR gates 28 in a data comparison circuit 29 within the data compression circuit module 17.

The XOR gates 28 are connected via lines 30 to an XOR circuit 31 whose output sends an indicator data item to the external test unit 5 via an indicator line 4-$i$ in the indicator data bus 4. The data comparison circuit 29 performs bit-by-bit data comparisons between the nominal data or reference data contained in the reference data register 22 and the test data in the test data sequence which has been read from the memory cell array 10. If a memory cell manufactured with a fault causes a test data bit in the test data sequence written to the test data register 20 to differ from the associated reference data bit stored in the reference data register 22, the output of the data comparison circuit 29 generates an indicator data item which indicates that at least one data error has occurred in the buffer-stored test data sequence.

Figure 6:
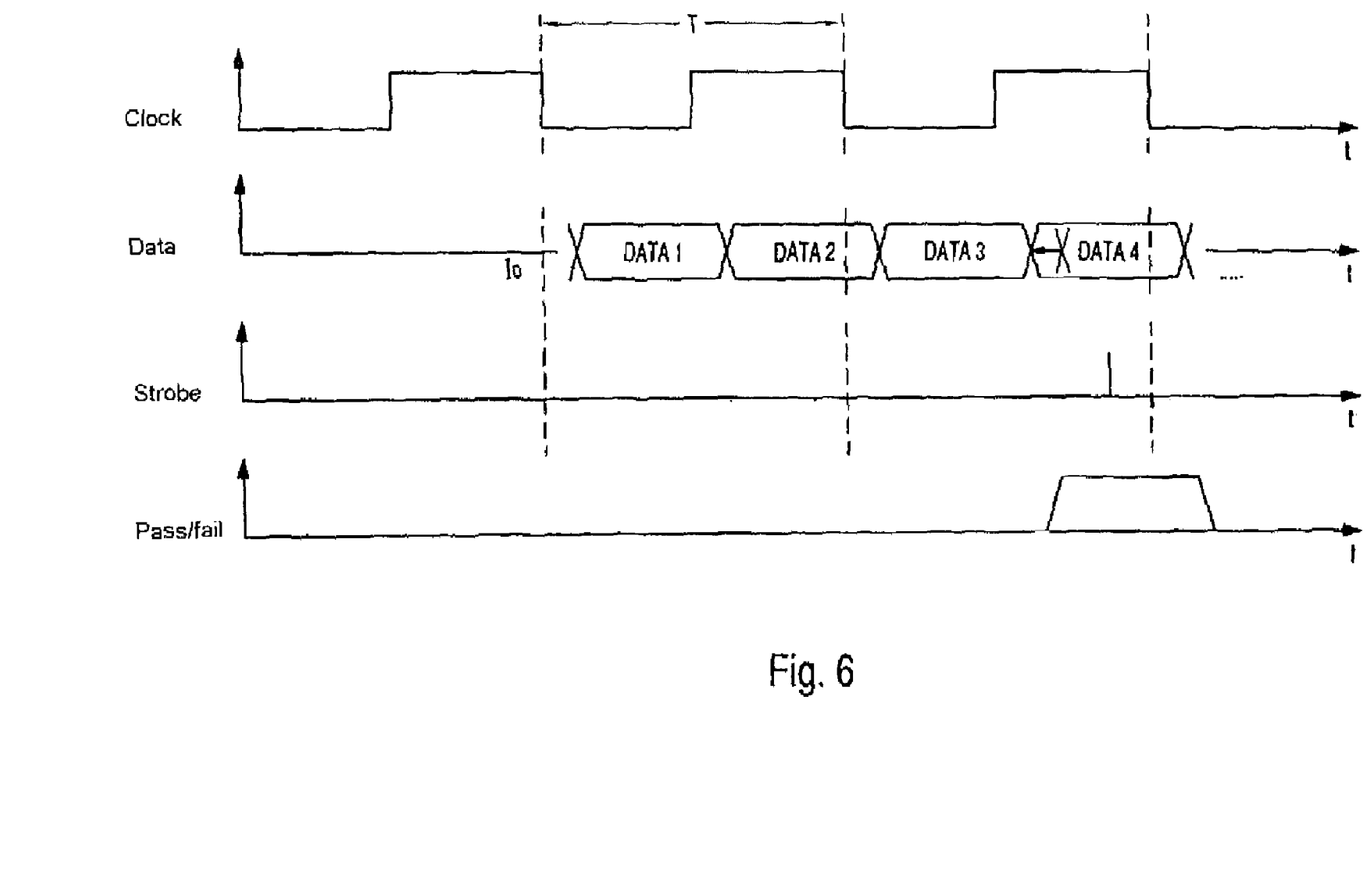
FIG. 6 shows a flow diagram for test signals when the inventive test method is proceeding.

FIG. 6 shows timing diagrams during a test procedure in line with the inventive test method for testing the data store 1 shown in FIG. 3. From the memory cell array 10 in the data store 1, a test data sequence, which includes four test data bits in the example shown in FIG. 6, is read and is applied serially via a data line in the internal data bus 12 and in the internal test data bus 15 to a test data compression circuit module 17, where it is written serially to the latter's test data register 20. The data comparison circuit 29 generates an indicator data item or pass/fail signal which is sent to the external test unit via an indicator data line in the indicator data bus 4 for the purpose of further data evaluation. The indicator data item is evaluated by the external test unit 5 using the strobe signal.

As can be seen from a comparison between FIGS. 2 and 6, the external test unit 5 can work, during the inventive test method, at a clock frequency which is lower by the data compression factor K than in the case of the conventional test arrangement. Each test data compression circuit module 17 within the compression circuit 16 performs test data compression with a test data compression factor K which corresponds to the number of test data bits within a test data sequence. In the example shown in FIG. 6, the test data sequence or the test data burst is four data bits which are compressed by a test data compression circuit module 17 to form an indicator data item, i.e. the test data compression factor K is four in the example shown in FIG. 6.

The test method can be used either to reduce the test time in line with the test data compression factor K or to reduce the maximum operating frequency required in the external test unit for data input and data output in line with the test data compression factor K. This means that it is possible to use existing conventional test units, whose circuitry is less complex, to test data stores which work at a very high operating clock frequency.

LIST OF REFERENCE NUMERALS FOR FIGURES

1. Data store
2. Address bus
3. External data bus
4. Indicator data bus
5. External test unit
6. Column address decoder
7. Row address decoder
8. Lines
9. Lines
10. Memory cell array
11. Read/write amplifier
12. Internal data bus
13. Switching unit
14. Control lines
15. Internal test data bus
16. Test data compression circuit
17. Test data compression circuit modules
18. Controllable switching device
19. Line
20 Test data register
21 Test data storage locations
22 Reference data register
23 Lines
24 Control line
25 Reference data storage location
26 Lines
27 Lines
28 XOR gate
29 Data comparison circuit
30 Lines
31 XOR circuit

The invention claimed is:

1. A test method for testing a data store comprising:
   reading serially from the data store a plurality of test data in a test data sequence; and
   comparing the test data with reference nominal data that is written in a reference data register by an external test unit that is external to the data store in order to produce a compressed indicator data item,
   wherein the test data sequence is produced in a test data generator in an external test unit, and the test data in the test data sequence which have been read are written serially in a test data register in a test data compression circuit and are compared by logic gates bit by bit with reference nominal data written in a reference data register in the test data compression circuit in an initialization mode of operation;
   wherein a logic comparison circuit logically combines the outputs of the logic gates to form the compressed indicator data item, which indicates whether at least one data error has occurred in the test data sequence and wherein the compressed indicator data item is sent from the data store to the external test unit via an indicator data bus connecting the data store and the external test unit, and
   wherein the test data sequence is written to a memory cell array in the data store via a data line in a data bus, with the test data sequence written subsequently being read from the memory cell array in the data store via a data line in the data bus and being compressed by a test data compression circuit integrated in the data store on the basis of a compression factor (K) to form an indicator data item which is sent from the data store to the external test unit via an indicator data line in an indicator data bus for the purpose of evaluation.

2. The test method of claim 1, wherein the test data sequence comprises a prescribed number (M) of test data bits.

3. The test method of claim 1, wherein the test data sequence comprises a prescribed number (M) of test data bits and wherein the compression factor (K) is equal to the number (M) of test data bits in the test data sequence.

4. The test method of claim 1, wherein the test data are written to the memory cell array in the data store by the external test unit at a first data transmission rate via the data bus and the indicator data are sent from the data compression circuit in the data store to the external test unit at a second data transmission rate, the ratio of the first data transmission rate to the second data transmission rate corresponding to the compression factor (K).

5. A data store having an integrated test data compression circuit comprising:
   (a) a memory cell array with a multiplicity of addressable memory cells;
   (b) read/write amplifiers for reading and writing data to the memory cells via an internal data bus in the data store;
   (c) and a test data compression circuit comprising a test data register for storing test data in a test data sequence which have been read from the memory cell array, a reference register for storing reference nominal data which are written in by an external test unit, which is external to data store, in an initialization mode of operation, a plurality of logic gates which compare test data stored in the test data register bit by bit with the reference nominal data stored in the reference register and comprise a logic comparison circuit which logically combines the outputs of the logic gates to form a compressed indicator data item which indicates whether at least one data error is contained in the buffer-stored test data sequence;
   (d) an indicator bus configured to send the compressed indicator data item from the data store to the external test unit; and
   (e) a controllable switching unit connected between an external data bus for data interchange with the external test unit, the internal data bus for data interchange with the memory cell array, and the test data compression circuit.

6. The data store of claim 5, wherein the test data compression circuit transmits the indicator data to an external test unit via indicator data lines in an indicator data bus for evaluation.

7. The data store of claim 5, wherein the controllable switching unit can be changed over by the external test unit between a normal mode of operation and a test mode of operation via a control line, with the test data in a test data sequence which have been read via a data line in the internal data bus being written serially to a test data register in the test data compression circuit via a data line in an internal test data bus by the switching unit in the test mode of operation.

8. The data store of claim 7, wherein the external data bus, the internal data bus, the test data bus and an indicator data bus have the same bus width.

9. The data store of claim 5, wherein the test data sequence has a prescribed number (M) of test data bits.

10. The data store of claim 5, wherein the test data compression circuit comprises a plurality of test data compression circuit modules which each have a test data register for storing a test data sequence read from the memory cell array via a data line in the test data bus, a reference data register for storing a reference test data sequence, and a logic comparison circuit which compares the stored test data sequence with the stored reference test data sequence in order to produce an indicator data item.

11. A data store having an integrated test data compression circuit comprising:
   (a) a memory cell array with a multiplicity of addressable memory cells;
   (b) read/write amplifiers for reading and writing data to the memory cells via an internal data bus in the data store;
   (c) and a test data compression circuit comprising a test data register for storing test data in a test data sequence which have been read from the memory cell array, a reference register for storing reference nominal data which are written in by an external test unit, which is external to data store, in an initialization mode of operation, a plurality of logic gates which compare the test data buffer-stored in the test data register bit by bit with the reference nominal data stored in the reference register and comprise a logic comparison circuit which logically combines the outputs of the logic gates to form a compressed indicator data item which indicates whether at least one data error is contained in the buffer-stored test data sequence; and
   (d) an indicator bus configured to send the compressed indicator data item from the data store to the external test unit;
   wherein the test data sequence is written to the memory cell array in the data store via a data line in the internal data bus, with the test data sequence written subsequently being read from the memory cell array in the data store via a data line in the internal data bus and being compressed by the test data compression circuit integrated in the data store on the basis of a compression factor (K) to form the compressed indicator data item which is sent from the data store to the external test unit via an indicator data line in the indicator data bus for the purpose of evaluation.

* * * * *